United States Patent
Morimoto et al.

(10) Patent No.: US 8,860,524 B2
(45) Date of Patent: Oct. 14, 2014

(54) POLAR MODULATOR

(75) Inventors: Shigeru Morimoto, Osaka (JP); Kaoru Ishida, Kanagawa (JP); Maki Nakamura, Kanagawa (JP)

(73) Assignee: Panasonic Corporation, Osaka (JP)

( * ) Notice: Subject to any disclaimer, the term of this patent is extended or adjusted under 35 U.S.C. 154(b) by 361 days.

(21) Appl. No.: 13/382,029

(22) PCT Filed: Jun. 17, 2010

(86) PCT No.: PCT/JP2010/004041
§ 371 (c)(1),
(2), (4) Date: Jan. 3, 2012

(87) PCT Pub. No.: WO2011/004553
PCT Pub. Date: Jan. 13, 2011

(65) Prior Publication Data
US 2012/0106402 A1 May 3, 2012

(30) Foreign Application Priority Data
Jul. 8, 2009 (JP) ................. 2009-162068

(51) Int. Cl.
*H03C 1/00* (2006.01)
*H03F 3/24* (2006.01)
*H03F 3/189* (2006.01)
*H03C 5/00* (2006.01)
*H03F 1/02* (2006.01)
*H04B 1/04* (2006.01)

(52) U.S. Cl.
CPC .................. *H03F 3/24* (2013.01); *H03F 3/189* (2013.01); *H04B 1/04* (2013.01); *H03C 5/00* (2013.01); *H03F 1/0266* (2013.01)
USPC ........... 332/149; 332/159; 332/151; 330/131; 455/102; 455/114.2

(58) Field of Classification Search
CPC .................. H04L 27/36; H04B 1/04
USPC ........ 375/295, 298; 455/114.2, 102; 332/149, 332/159, 151; 330/131
See application file for complete search history.

(56) References Cited

U.S. PATENT DOCUMENTS

| 6,404,823 B1 | 6/2002 | Grange et al. |
| 6,909,757 B2 | 6/2005 | Justice et al. |

(Continued)

FOREIGN PATENT DOCUMENTS

| JP | 2007-180782 | 7/2007 |
| JP | 2008-514044 | 5/2008 |

(Continued)

OTHER PUBLICATIONS

International Search Report issued Aug. 10, 2010 in corresponding International Application No. PCT/JP2010/004041.

*Primary Examiner* — Arnold Kinkead
(74) *Attorney, Agent, or Firm* — Wenderoth, Lind & Ponack, L.L.P.

(57) ABSTRACT

A polar modulator of the present invention includes: a first function block which generates an amplitude signal and a phase signal; a second function block which adjusts the signal delay between the amplitude signal and the phase signal; a third function block which allows the low frequency component of the amplitude signal to pass therethrough; a fourth function block which modulates the phase of the phase signal; a fifth function block which outputs a modulation voltage, based on the amplitude signal; a sixth function block which modulates the amplitude of the phase signal, based on the modulation voltage; a seventh function block which measures the temperature of at least one function block; and an eighth function block which calculates a compensation amount for the signal delay, based on the measured temperature. The second function block adjusts the signal delay, based on the compensation amount.

9 Claims, 10 Drawing Sheets

(56) References Cited

U.S. PATENT DOCUMENTS

| | | |
|---|---|---|
| 7,983,359 B2 * | 7/2011 | Reddy et al. .................. 375/298 |
| 8,195,103 B2 * | 6/2012 | Waheed et al. ............ 455/114.3 |
| 2006/0057976 A1 | 3/2006 | Klemmer |
| 2007/0129032 A1 | 6/2007 | Matsuura et al. |
| 2008/0031381 A1 * | 2/2008 | Matsuura et al. ............. 375/297 |

FOREIGN PATENT DOCUMENTS

| | | |
|---|---|---|
| JP | 2009-517891 | 4/2009 |
| WO | 2009/075100 | 6/2009 |

* cited by examiner

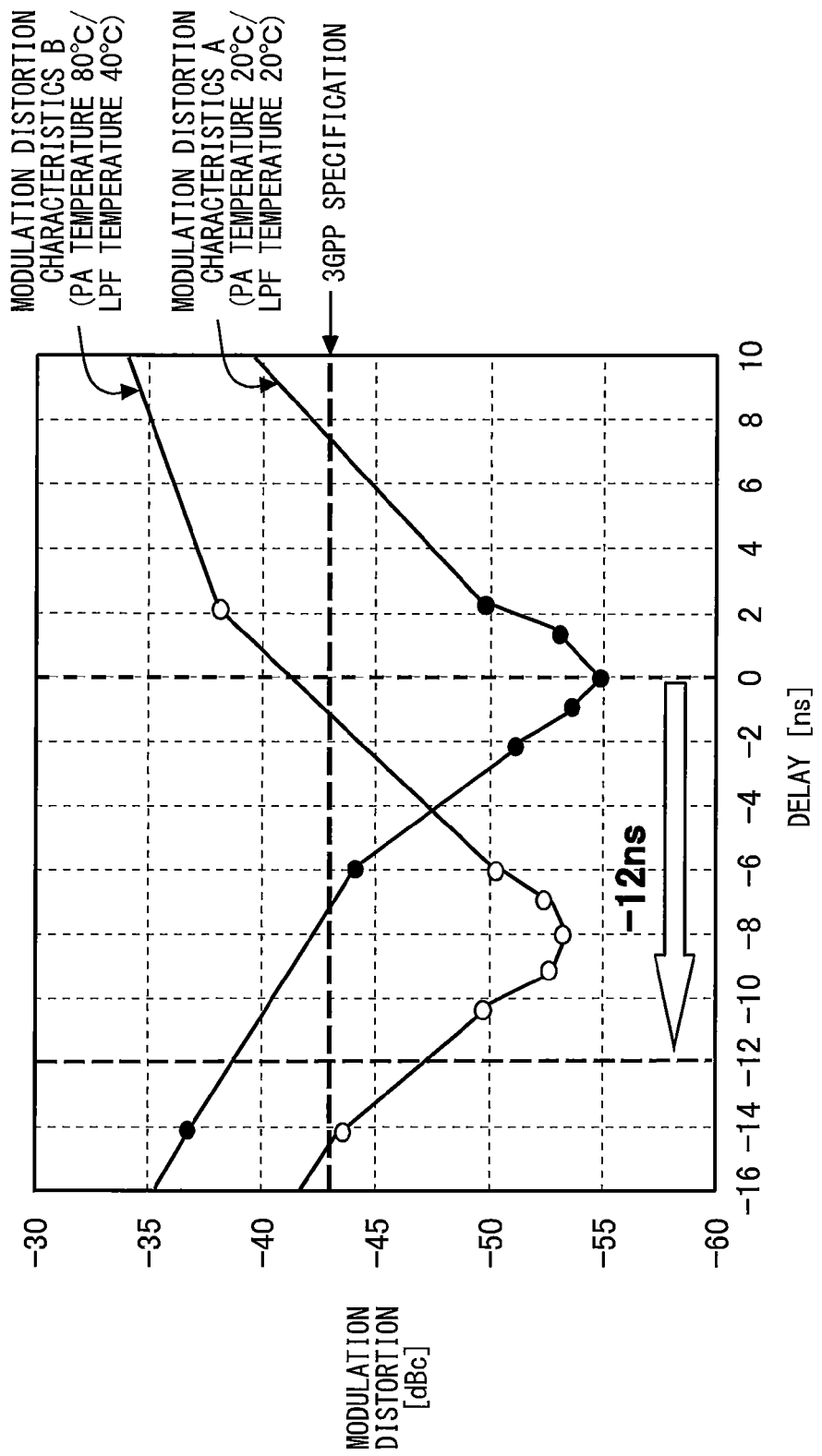
F I G. 2

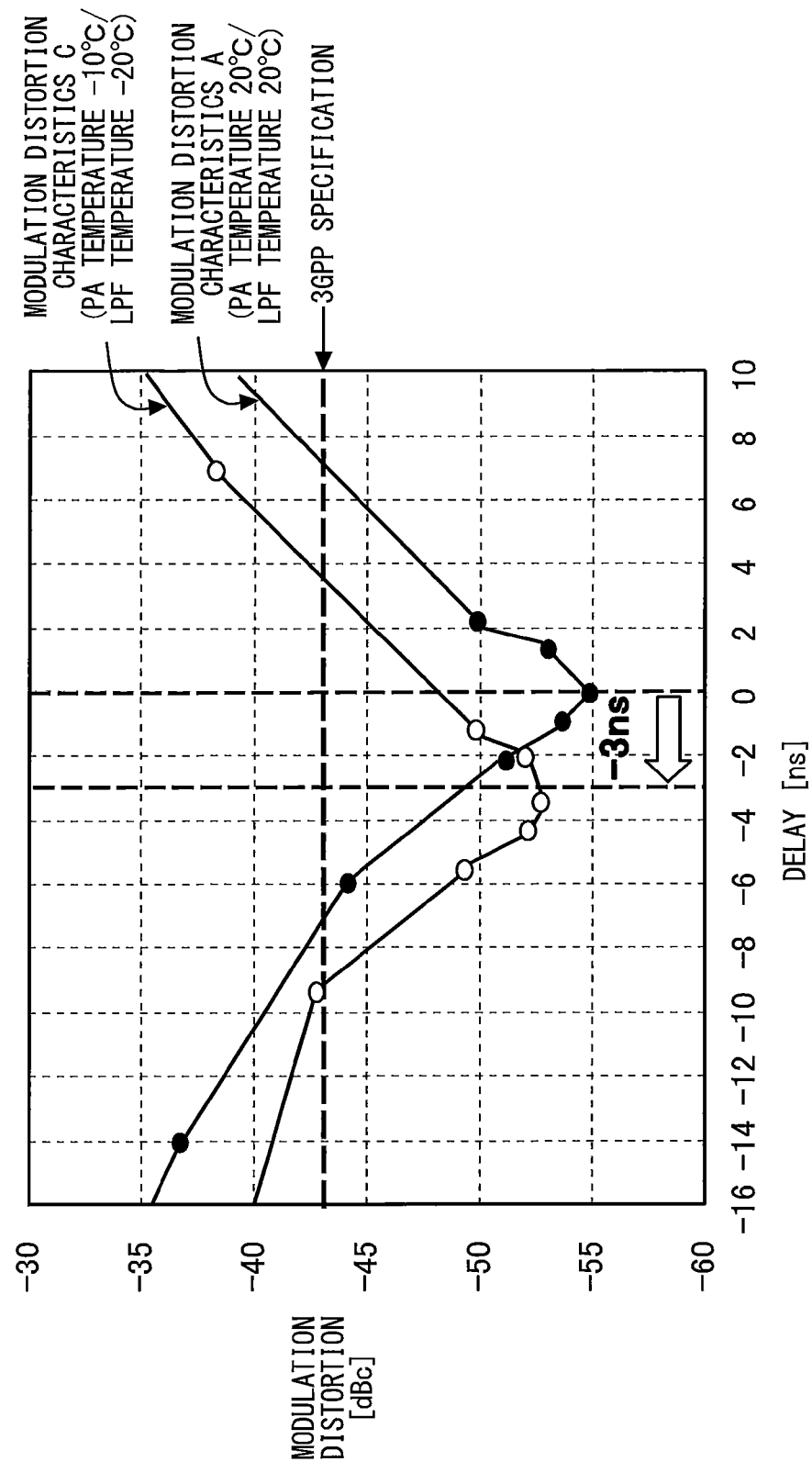
F I G. 5

FIG. 7

COMPENSATION AMOUNTS FOR SIGNAL DELAY IN EACH ELECTRONIC DEVICE (COMPONENT)

| TEMPERATURE [°C] | COMPENSATION AMOUNTS FOR SIGNAL DELAY [ns] | | | |
|---|---|---|---|---|
| | PA | LPF | EMIC | RFIC |
| -20 | 12.00 | -12.00 | 0.40 | -3.20 |
| -10 | 9.00 | -9.00 | 0.30 | -2.40 |
| 0 | 6.00 | -6.00 | 0.20 | -1.60 |
| 10 | 3.00 | -3.00 | 0.10 | -0.08 |
| 20 | 0.00 | 0.00 | 0.00 | 0.00 |
| 30 | -2.00 | 3.00 | -0.05 | 0.05 |
| 40 | -4.00 | 6.00 | -0.10 | 0.10 |
| 50 | -6.00 | 9.00 | -0.15 | 0.15 |
| 60 | -8.00 | 12.00 | -0.20 | 0.20 |
| 70 | -10.00 | 15.00 | -0.25 | 0.25 |
| 80 | -12.00 | 18.00 | -0.30 | 0.30 |
| 90 | -14.00 | 21.00 | -0.35 | 0.35 |
| 100 | -16.00 | 24.00 | -0.40 | 0.40 |

POLAR MODULATOR

TECHNICAL FIELD

The present invention relates to a polar modulator for performing amplitude modulation in communication devices such as mobile phones and wireless LAN devices, and particularly relates to a polar modulator for adjusting the signal delay between an amplitude signal and a phase signal which are generated from an input signal.

BACKGROUND ART

Communication devices such as mobile phones and wireless LAN devices are required to secure the precision of a transmission signal and operate with a low power consumption. For such communication devices, a transmission circuit that is small in size, operates with high efficiency, and outputs a transmission signal having high linearity, is used.

As conventional transmission circuits, for example, there are transmission circuits for generating a transmission signal by using a modulation method such as quadrature modulation (hereinafter, referred to as quadrature modulation circuits). In addition, polar modulation circuits are known as conventional transmission circuits that are small in size and operate with high efficiency as compared to the quadrature modulation circuits.

A polar modulation circuit generates an amplitude signal and a phase signal from an input signal, and modulates the amplitude signal and the phase signal separately. Then, the amplitude signal and the phase signal which have been modulated in different paths are inputted to an power amplifier. This results in a problem of increase in modulation distortion due to the signal delay between the amplitude signal and the phase signal.

In view of the above, a polar modulator for adjusting modulation distortion due to the signal delay between an amplitude signal and a phase signal is conventionally proposed (see Patent Literature 1 and Patent Literature 2, for example). FIG. 9 shows a conventional polar modulator 900. In FIG. 9, the polar modulator 900 includes a signal generation unit 901, a delay adjustment unit 902, a DAC 903, a phase modulator 904, a low-pass filter (LPF) 905, an amplitude signal driven unit 906, and a power amplifier (PA) 907. The signal generation unit 901, the delay adjustment unit 902, the DAC 903, and the phase modulator 904 are implemented on a Radio Frequency Integrated Circuit (RFIC) 910. These function blocks (electronic components) are arranged on a substrate 920 to form the polar modulator 900.

The signal generation unit 901 generates an amplitude signal and a phase signal from an input signal. The amplitude signal generated by the signal generation unit 901 is subjected to delay adjustment by the delay adjustment unit 902. Then, the amplitude signal having been subjected to the delay adjustment is inputted as an amplitude-modulated signal to the amplitude signal driven unit 906 through the DAC 903 and the LPF 905. The amplitude signal driven unit 906 applies, to the power amplifier 907, a modulation voltage corresponding to the amplitude-modulated signal. Meanwhile, the phase signal generated by the signal generation unit 901 is inputted as a phase-modulated signal to the power amplifier 907 through the phase modulator 904. The power amplifier 907 modulates the amplitude of the phase-modulated signal inputted from the phase modulator 904 by means of the modulation voltage applied by the amplitude signal driven unit 906, and outputs the resultant signal as an output signal.

The amplitude signal driven unit 906 controls an envelope signal, and thus is referred to as an EMIC (Envelope Management IC).

Here, the conventional delay adjustment performed by the delay adjustment unit 902 will be briefly described. Patent Literature 1 discloses a configuration in which the signal delay between an amplitude signal and a phase signal is adjusted based on a transmission power, and further discloses a configuration in which an ACPR (Adjacent Channel Power Ratio) and an EVM (Error Vector Magnitude) are used in order to adjust the signal delay between an amplitude signal and a phase signal. Patent Literature 2 also discloses a configuration in which the signal delay between an amplitude signal and a phase signal is controlled based on an ACPR and an EVM.

Thus, the conventional polar modulator 900 adjusts modulation distortion due to the signal delay between an amplitude signal and a phase signal by means of the delay adjustment unit 902 described above.

CITATION LIST

Patent Literature

[Patent Literature 1] U.S. Pat. No. 6,909,757
[Patent Literature 2] U.S. Pat. No. 6,404,823

SUMMARY OF THE INVENTION

Problems to be Solved by the Invention

However, if the temperatures of the function blocks (electronic components) of the polar modulator 900 change, the signal delay between an amplitude signal and a phase signal also changes accordingly. The conventional polar modulator can adjust the signal delay in accordance with a transmission power, but cannot adjust the signal delay in accordance with the changes in the temperatures. Therefore, the conventional polar modulator has a disadvantage in that if the temperatures of the function blocks (electronic components) of the polar modulator change, modulation distortion due to the signal delay between the amplitude signal and the phase signal cannot be adjusted to an optimal state.

FIG. 10 shows the characteristics of modulation distortion due to the signal delay between an amplitude signal and a phase signal. FIG. 10 shows modulation distortion characteristics A (plotted by black circles) when the temperatures of both the power amplifier 907 and the LPF 905 are 20° C., and modulation distortion characteristics B (plotted by white circles) when the temperature of the power amplifier 907 is 80° C. and the temperature of the LPF 905 is 40° C. As shown in FIG. 10, it is understood that when the temperatures of the power amplifier 907 and the LPF 905 increase, the characteristics of modulation distortion greatly change from A to B.

As indicated by the modulation distortion characteristics A, when the temperatures of both the power amplifier 907 and the LPF 905 are 20° C., if the signal delay is set to 0 ns, the modulation distortion will be −55 dBc, which is an optimal state. If the temperature of the power amplifier 907 increases from 20° C. to 80° C. and the temperature of the LPF 905 increases from 20° C. to 40° C., the characteristics of modulation distortion greatly change from A to B. In this case, since the signal delay is 0 ns, the modulation distortion is −42 dBc, which is far from the optimal state. Moreover, the 3GPP (Third Generation Partnership Project) standards cannot be satisfied.

Therefore, an object of the present invention is to provide a polar modulator that adjusts, even when the temperatures of the function blocks (electronic components) of the polar modulator change, modulation distortion due to the signal delay between an amplitude signal and a phase signal to an optimal state by adjusting the signal delay in accordance with the changes in the temperatures.

Solution to the Problems

In order to attain the above objects, a polar modulator of the present invention includes a plurality of function blocks, and comprises: a first function block configured to generate an amplitude signal and a phase signal from an input signal; a second function block configured to adjust the signal delay between the amplitude signal and the phase signal; a third function block configured to allow the low frequency component of the amplitude signal from the second function block to pass therethrough; a fourth function block configured to modulate the phase of the phase signal from the second function block; a fifth function block configured to output a modulation voltage, based on the amplitude signal from the third function block; a sixth function block configured to modulate the amplitude of the phase signal from the fourth function block, based on the modulation voltage from the fifth function block; a seventh function block configured to measure the temperatures of one or more function blocks of the first to sixth function blocks; and an eighth function block configured to calculate a compensation amount for the signal delay, based on the temperatures of the one or more function blocks measured by the seventh function block. The second function block adjusts delay of at least one of the amplitude signal and the phase signal, based on the compensation amount for the signal delay calculated by the eighth function block.

The seventh function block preferably measures the temperature of a ninth function block which is a radio frequency integrated circuit including the first function block, the second function block, the fourth function block, and the eighth function block.

The polar modulator of the present invention preferably further includes a tenth function block configured to previously store compensation amounts for the signal delay which correspond to values of the temperatures of the plurality of function blocks. In the calculation of the compensation amount for the signal delay, the eighth function block obtains a compensation amount for the signal delay stored in the tenth function block, based on the temperatures of the one or more function blocks measured by the seventh function.

Alternatively, the polar modulator of the present invention preferably further includes a tenth function block configured to previously store temperature compensation coefficients for the plurality of function blocks, the temperature compensation coefficients being equivalent to compensation amounts for the signal delay per unit amount of change in the temperatures. The eighth function block obtains a temperature compensation coefficient stored in the tenth function block, based on the temperatures of the one or more function blocks measured by the seventh function block, and calculates a compensation amount for the signal delay.

In addition, at least one of the one or more function blocks whose temperatures are measured by the seventh function block typically includes an analog component.

In addition, at least one of the one or more function blocks whose temperatures are measured by the seventh function block is typically the sixth function block.

In addition, at least one of the one or more function blocks whose temperatures are measured by the seventh function block is typically the third function block.

In addition, at least one of the one or more function blocks whose temperatures are measured by the seventh function block is typically the fifth function block.

In order to attain the above objects, a communication device of the present invention includes a transmission circuit configured to generate a transmission signal, and an antenna configured to output the transmission signal generated by the transmission circuit, and the polar modulator according to claim 1 is used for the transmission circuit.

The communication device of the present invention preferably further includes a reception circuit configured to process a reception signal received from the antenna, and an antenna duplexer configured to output, to the antenna, the transmission signal generated by the transmission circuit, and output, to the reception circuit, the reception signal received from the antenna.

Advantageous Effects of the Invention

As described above, according to the present invention, the signal delay between an amplitude signal and a phase signal is adjusted based on temperature information about function blocks (electronic components) in accordance with changes in the temperatures. Therefore, a polar modulator can be realized that can adjust modulation distortion due to the signal delay to an optimal state even when the temperatures of the function blocks (electronic components) of the polar modulator change.

BRIEF DESCRIPTION OF THE DRAWINGS

FIG. 2 shows the characteristics of modulation distortion due to the signal delay between an amplitude signal and a phase signal, and compensation amounts for the signal delay which are based on change in temperature (increase in temperature).

FIG. 5 shows the characteristics of modulation distortion due to the signal delay between an amplitude signal and a phase signal, and compensation amounts for the signal delay which are based on change in temperature (decrease in temperature).

FIG. 7 shows compensation amounts for the signal delay which correspond to values of the temperatures of function blocks (electronic components).

DESCRIPTION OF EMBODIMENTS

Hereinafter, embodiments of the present invention will be described with reference to the drawings.

First Embodiment

Figure 1:
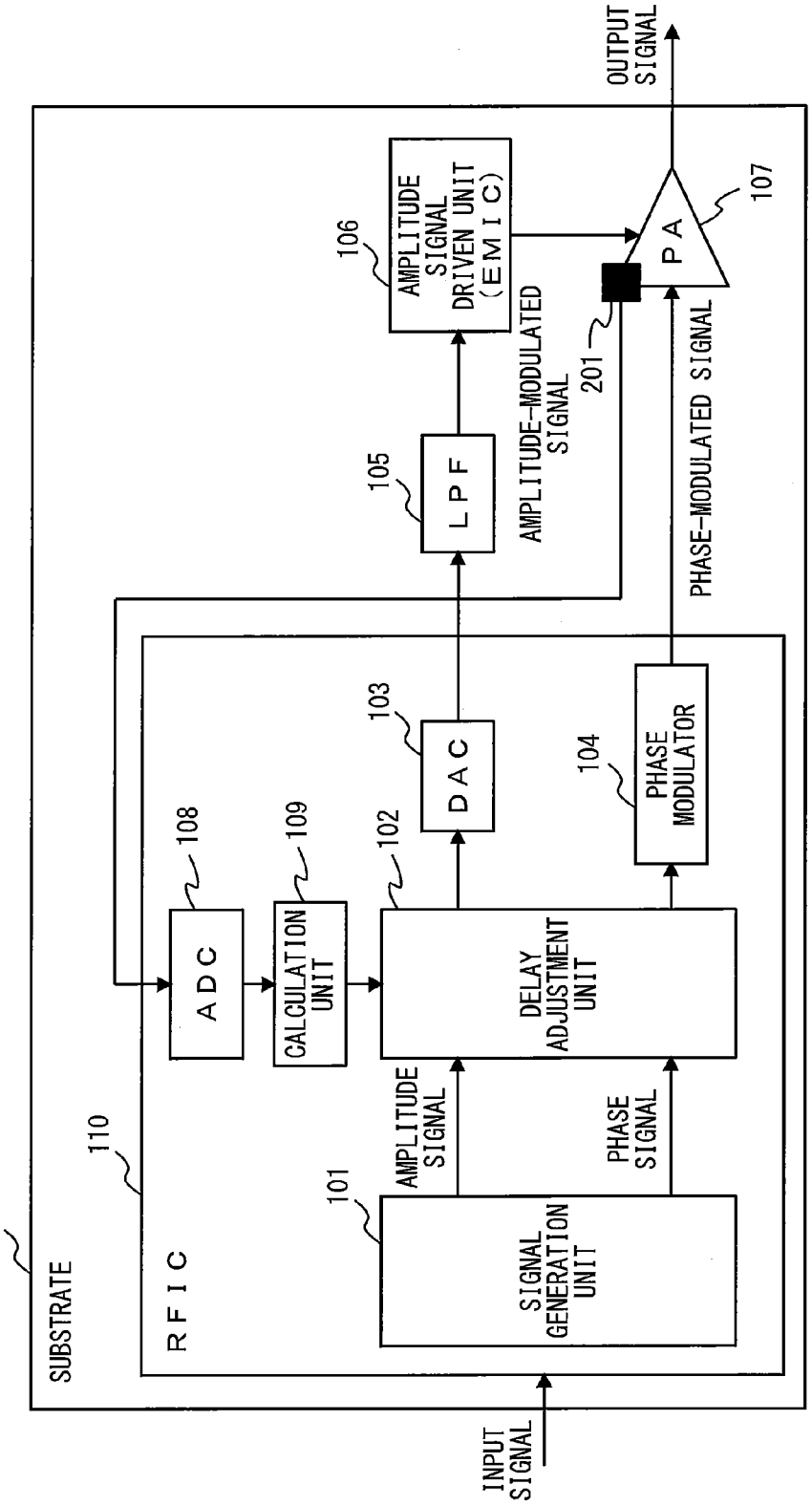
FIG. 1 shows a polar modulator 100 according to a first embodiment of the present invention.

FIG. 1 shows a polar modulator 100 according to the first embodiment of the present invention. In FIG. 1, the polar modulator 100 includes a signal generation unit 101, a delay adjustment unit 102, a DAC 103, a phase modulator 104, a low-pass filter (LPF) 105, an amplitude signal driven unit 106, a power amplifier (PA) 107, an ADC 108, a calculation unit 109, and a temperature measurement unit 201. The signal generation unit 101, the delay adjustment unit 102, the DAC 103, the phase modulator 104, the ADC 108, and the calculation unit 109 are implemented on an RFIC 110. These function blocks (electronic components) are arranged on a substrate 120 to form the polar modulator 100.

The signal generation unit 101 generates an amplitude signal and a phase signal from an input signal. The amplitude signal and/or the phase signal generated by the signal generation unit 101 are subjected to delay adjustment by the delay adjustment unit 102. Then, the amplitude signal outputted from the delay adjustment unit 102 is inputted as an amplitude-modulated signal to the amplitude signal driven unit 106 through the DAC 103 and the LPF 105. The amplitude signal driven unit 106 applies, to the power amplifier 107, a modulation voltage corresponding to the amplitude-modulated signal. Meanwhile, the phase signal outputted from the delay adjustment unit 102 is inputted as a phase-modulated signal to the power amplifier 107 through the phase modulator 104. In this embodiment, it is assumed that the phase modulator 104 includes a DAC. The power amplifier 107 modulates the amplitude of the phase-modulated signal inputted from the phase modulator 104 by means of the modulation voltage applied by the amplitude signal driven unit 106, and outputs the resultant signal as an output signal. The amplitude signal driven unit 106 controls an envelope signal, and thus is referred to as an EMIC.

The configuration and operation of the polar modulator 100 which have been described above are substantially the same as the configuration and operation of the conventional polar modulator 900. The polar modulator 100 according to the present embodiment further includes the temperature measurement unit 201, the ADC 108, and the calculation unit 109, in addition to the components of the conventional polar modulator 900.

The temperature measurement unit 201 measures the temperature of the power amplifier 107. Temperature information representing the temperature of the power amplifier 107 measured by the temperature measurement unit 201 is digitally converted by the ADC 108, and is inputted to the calculation unit 109. Typically, the temperature information is represented by using a voltage value.

The calculation unit 109 calculates a compensation amount for the signal delay between the amplitude signal and the phase signal, based on the temperature information representing the temperature of the power amplifier 107 measured by the temperature measurement unit 201. Detailed descriptions are given below.

FIG. 2 shows the characteristics of modulation distortion due to the signal delay between the amplitude signal and the phase signal, and compensation amounts for the signal delay which are based on change in temperature (increase in temperature). FIG. 2 shows the modulation distortion characteristics A (plotted by black circles) when the temperatures of both the power amplifier 107 and the LPF 105 are 20° C., and the modulation distortion characteristics B (plotted by white circles) when the temperature of the power amplifier 107 is 80° C. and the temperature of the LPF 105 is 40° C.

First, in an initial state, the delay adjustment unit 102 sets the signal delay between the amplitude signal and the phase signal in such a manner that the modulation distortion due to the signal delay under a reference temperature is in an optimal state. In this embodiment, the reference temperature is 20° C., and the delay adjustment unit 102 sets the signal delay at 0 ns to cause the modulation distortion to be in an optimal state (−55 dBc), as indicated by the modulation distortion characteristics A when the temperatures of both the power amplifier 107 and the LPF 105 are 20° C.

Then, if the temperature of the power amplifier 107 increases from 20° C. to 80° C., and the temperature of the LPF 105 increases from 20° C. to 40° C., the characteristics of modulation distortion greatly change from A to B. At this time, the temperature measurement unit 201 monitors the temperature of the power amplifier 107, and measures the temperature of the power amplifier 107. The temperature measurement unit 201 notifies, via the ADC 108, the calculation unit 109 of the temperature information representing the measured temperature of the power amplifier 107.

The calculation unit 109 calculates a compensation amount for the signal delay, based on the temperature information representing the temperature of the power amplifier 107 measured by the temperature measurement unit 201. A compensation amount D [ns] for the signal delay is calculated by using a temperature compensation coefficient K [ns/° C.], a measured temperature Tm [° C.], and a reference temperature Tb [° C.], in accordance with (expression 1) shown below. The temperature compensation coefficient K is equivalent to a compensation amount for the signal delay per unit amount of change in the temperature of a function block (electronic component) from the reference temperature, and is previously determined for each function block (electronic component) in accordance with the characteristics of the function block.

$$D = K \times (Tm - Tb) \quad \text{(expression 1)}$$

In the polar modulator 100 according to the present embodiment, the reference temperature Tb is 20 [° C.], and the temperature compensation coefficient K of the power amplifier 107 is −0.2 [ns/° C.]. When the measured temperature Tm of the power amplifier 107 which is measured by the temperature measurement unit 201 is 80 [° C.], the compensation amount D for the signal delay is calculated as −12 [ns].

The delay adjustment unit 102 sets the signal delay at 0 ns in the initial state where the temperatures of both the power amplifier 107 and the LPF 105 are 20° C. Next, the delay adjustment unit 102 adjusts the signal delay from 0 ns to −12 ns, based on the compensation amount D for the signal delay which has been calculated as −12 [ns] by the calculation unit 109.

If the temperature of the power amplifier 107 increases from 20° C. to 80° C. and the temperature of the LPF 105 increases from 20° C. to 40° C. the characteristics of modulation distortion greatly change from A to B. In this case, if the signal delay remained at 0 ns as set in the initial state, the modulation distortion would be −42 dBc. However, as described above, since the delay adjustment unit 102 adjusts the signal delay from 0 ns to −12 ns, the modulation distortion is −47 dBc.

As described above, the delay adjustment unit 102 in the polar modulator 100 according to the present embodiment adjusts the signal delay based on the temperature information about the power amplifier 107. Therefore, although not reaching the optimal state, the modulation distortion due to the signal delay in the whole of the polar modulator 100 is improved to satisfy the 3GPP standards and to become approximate to the optimal state.

As described above, according to the polar modulator 100 of the first embodiment of the present invention, even when the temperatures of the function blocks (electronic components) of the polar modulator 100 change, since the signal delay between the amplitude signal and the phase signal is adjusted based on the temperature information about the power amplifier 107 in accordance with a change in the temperature, the modulation distortion due to the signal delay can be approximated to the optimal state.

Although in the present embodiment, the signal delay between the amplitude signal and the phase signal is adjusted based on the temperature information about the power amplifier 107, a function block (electronic component) whose temperature is monitored is not limited to the power amplifier 107. For example, the temperature of the LPF 105 may be monitored. In the case where the LPF 105 is the main factor for the modulation distortion due to the signal delay between the amplitude signal and the phase signal, if the signal delay is adjusted based on temperature information representing a measured temperature of the LPF 105, the same effect as described above can be obtained.

The temperature information represents a measured temperature of the power amplifier 107 as a voltage value. However, the present invention is not limited thereto. For example, the temperature measurement unit 201 may notify the calculation unit 19 of the amount of change in temperature from a reference temperature to a measured temperature as the temperature information.

The delay adjustment unit 102 may adjust the signal delay between the amplitude signal and the phase signal by adjusting the amount of delay of either the amplitude signal or the phase signal, or may adjust the signal delay between the amplitude signal and the phase signal by adjusting the amount of delay of both the amplitude signal and the phase signal.

Second Embodiment

Figure 3:
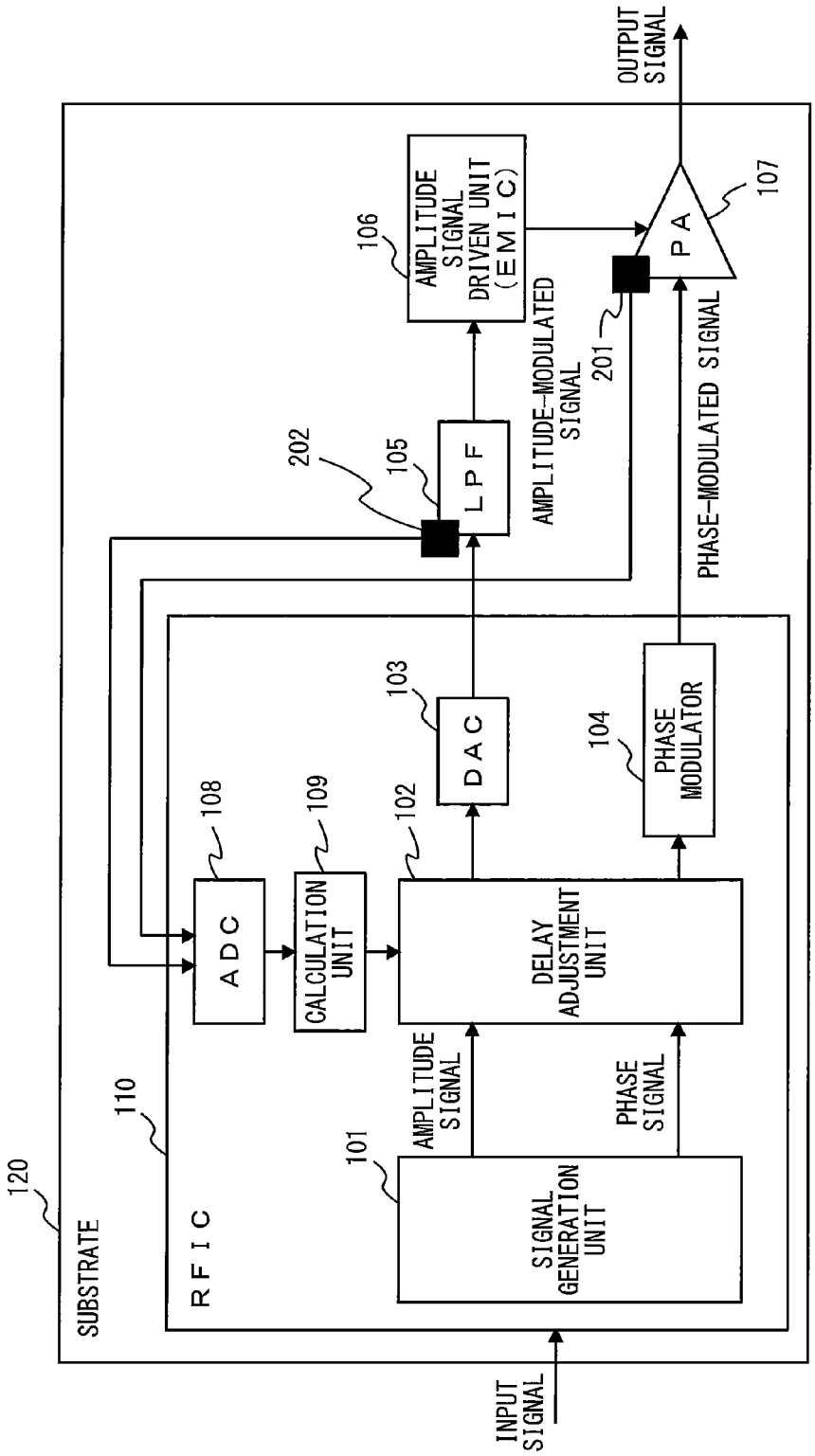
FIG. 3 shows a polar modulator 200 according to a second embodiment of the present invention.

FIG. 3 shows a polar modulator 200 according to the second embodiment of the present invention. In FIG. 3, the polar modulator 200 includes the signal generation unit 101, the delay adjustment unit 102, the DAC 103, the phase modulator 104, the low-pass filter (LPF) 105, the amplitude signal driven unit 106, the power amplifier (PA) 107, the ADC 108, the calculation unit 109, a first temperature measurement unit 201, and a second temperature measurement unit 202. The signal generation unit 101, the delay adjustment unit 102, the DAC 103, the phase modulator 104, the ADC 108, and the calculation unit 109 are implemented on the RFIC 110. These function blocks (electronic components) are arranged on the substrate 120 to form the polar modulator 200. In FIG. 3, the components of the polar modulator 200 according to the present embodiment that are the same as those of the polar modulator 100 according to the first embodiment of the present invention are denoted by the same reference characters, and the description thereof is omitted.

The polar modulator 200 according to the present embodiment is different from the polar modulator 100 according to the first embodiment of the present invention in that the polar modulator 200 includes the second temperature measurement unit 202. The polar modulator 100 according to the first embodiment of the present invention measures only the temperature of the power amplifier 107. The polar modulator 200 according to the present embodiment measures the temperature of the power amplifier 107 by means of the first temperature measurement unit 201, and also measures the temperature of the LPF 105 by means of the second temperature measurement unit 202.

Temperature information representing the temperature of the power amplifier 107 measured by the first temperature measurement unit 201, and temperature information representing the temperature of the LPF 105 measured by the second temperature measurement unit 202, are digitally converted by the ADC 108, and inputted to the calculation unit 109.

The calculation unit 109 calculates a compensation amount for the signal delay between the amplitude signal and the phase signal, based on the temperature information representing the temperature of the power amplifier 107 measured by the first temperature measurement unit 201 and the temperature information representing the temperature of the LPF 105 measured by the second temperature measurement unit 202. Detailed descriptions are given below.

Figure 4:
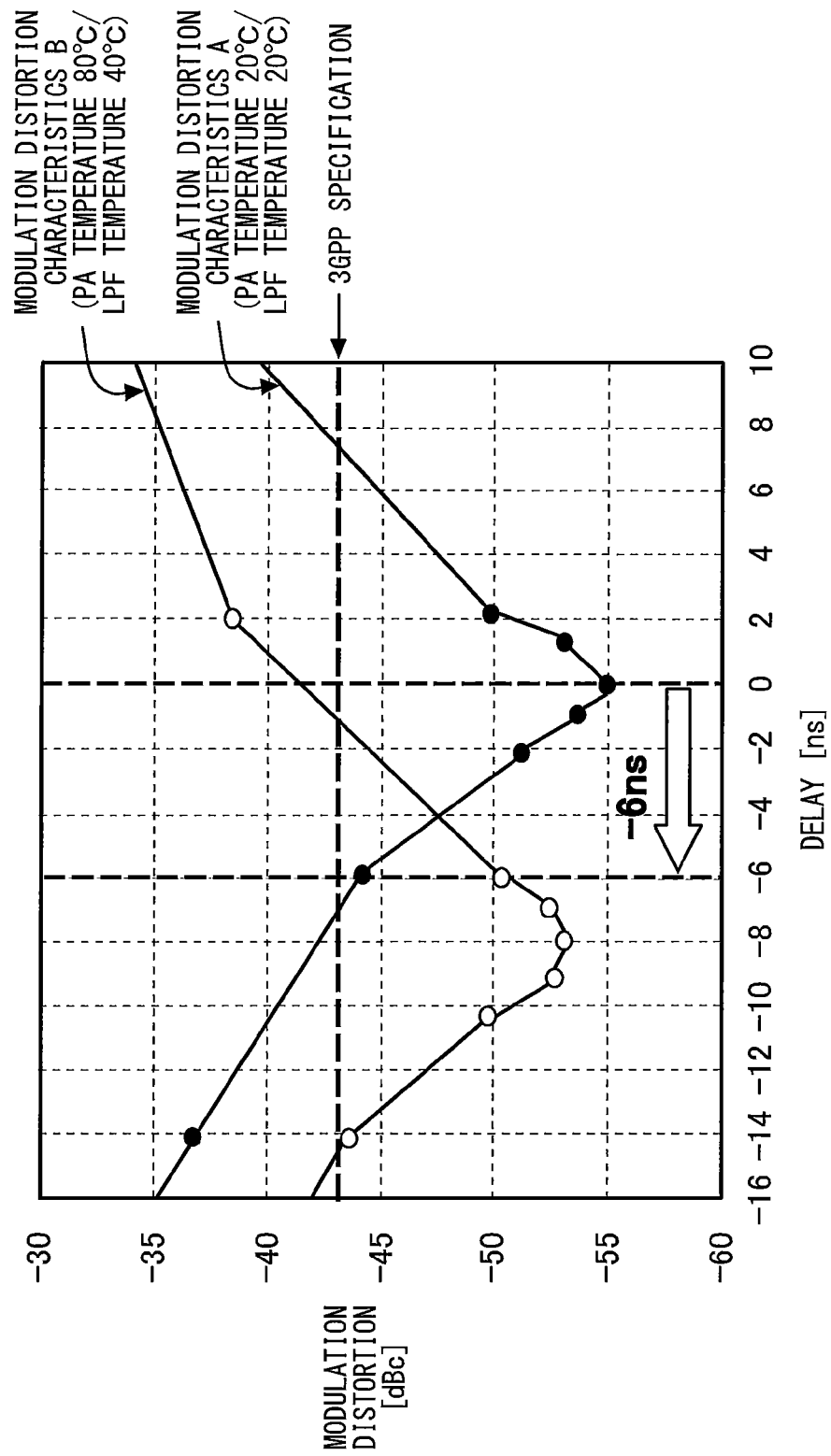
FIG. 4 shows the characteristics of modulation distortion due to the signal delay between an amplitude signal and a phase signal, and compensation amounts for the signal delay which are based on change in temperature (increase in temperature).

FIG. 4 shows the characteristics of modulation distortion due to the signal delay between the amplitude signal and the phase signal, and compensation amounts for the signal delay which are based on change in temperature (increase in temperature). FIG. 4 shows the modulation distortion characteristics A (plotted by black circles) when the temperatures of both the power amplifier 107 and the LPF 105 are 20° C., and the modulation distortion characteristics B (plotted by white circles) when the temperature of the power amplifier 107 is 80° C. and the temperature of the LPF 105 is 40° C.

First, as described in the first embodiment of the present invention, the delay adjustment unit 102 sets the signal delay between the amplitude signal and the phase signal at 0 ns in an initial state.

Next, a description will be given of the case where the temperature of the power amplifier 107 increases from 20° C. to 80° C., and the temperature of the LPF 105 increases from 20° C. to 40° C. The first temperature measurement unit 201 monitors the temperature of the power amplifier 107, and measures the temperature of the power amplifier 107. The first temperature measurement unit 201 notifies, via the ADC 108, the calculation unit 109 of the temperature information representing the measured temperature of the power amplifier 107. Similarly, the second temperature measurement unit 202 monitors the temperature of the LPF 105, and measures the temperature of the LPF 105. The second temperature measurement unit 202 notifies, via the ADC 108, the calculation unit 109 of the temperature information representing the measured temperature of the LPF 105.

The calculation unit 109 calculates a compensation amount $D_{PA}$ for the signal delay that is caused by the power amplifier 107, based on the temperature information representing the temperature of the power amplifier 107 measured by the first temperature measurement unit 201. Similarly, the calculation unit 109 calculates a compensation amount $D_{LPF}$ for the signal delay that is caused by the LPF 105, based on the temperature information representing the temperature of the LPF 105 measured by the second temperature measurement unit 202. Each of the compensation amount $D_{PA}$ for the signal delay that is caused by the power amplifier 107 and the compensation amount $D_{LPF}$ for the signal delay that is caused by the LPF 105 is calculated in accordance with (expression 1) described in the first embodiment of the present invention.

Here, a temperature compensation coefficient $K_{PA}$ of the power amplifier 107 is −0.2 [ns/° C.], and a temperature compensation coefficient $K_{LPF}$ of the LPF 105 is +0.3 [ns/° C.]. Therefore, the compensation amount $D_{PA}$ for the signal delay that is caused by the power amplifier 107 is −12 [ns], and the compensation amount $D_{LPF}$ for the signal delay that is caused by the LPF 105 is +6 [ns].

Further, a compensation amount D for the signal delay in the whole of the polar modulator 200 is calculated by using the $D_{PA}$ and $D_{LPF}$, in accordance with (expression 2) shown below.

$$D = D_{PA} + D_{LPF} \quad \text{(expression 2)}$$

Therefore, the compensation amount D for the signal delay in the whole of the polar modulator 200 is calculated as −6 [ns].

In the initial state where the temperatures of both the power amplifier 107 and the LPF 105 are 20° C., the delay adjustment unit 102 sets the signal delay at 0 ns. Next, the delay adjustment unit 102 adjusts the signal delay from 0 ns to −6 ns, based on the compensation amount D for the signal delay which has been calculated as −6 [ns] by the calculation unit 109.

If the temperature of the power amplifier 107 increases from 20° C. to 80° C., and the temperature of the LPF 105 increases from 20° C. to 40° C., the characteristics of modulation distortion greatly change from A to B. In this case, if the signal delay remained at 0 ns as set in the initial state, the modulation distortion would be −42 dBc. However, as described above, since the delay adjustment unit 102 adjusts the signal delay from 0 ns to −6 ns, the modulation distortion is −50 dBc.

As described above, the delay adjustment unit 102 in the polar modulator 200 according to the present embodiment adjusts the signal delay, based on the temperature information about the power amplifier 107 and the temperature information about the LPF 105. Accordingly, the modulation distortion due to the signal delay in the whole of the polar modulator 200 becomes more approximate to the optimal state than that in the polar modulator 100 according to the first embodiment of the present invention which adjusts the signal delay based on only the temperature information about the power amplifier 107.

As described above, according to the polar modulator 200 of the second embodiment of the present invention, even when the temperatures of the function blocks (electronic components) of the polar modulator 200 change, since the signal delay between the amplitude signal and the phase signal is adjusted, based on the temperature information about the power amplifier 107 and the temperature information about the LPF 105, in accordance with changes in the temperatures, the modulation distortion due to the signal delay can be approximated to the optimal state.

The case where the temperatures of the power amplifier 107 and the LPF 105 increase has been described above. Hereinafter, the case where the temperatures of the power amplifier 107 and the LPF 105 decrease will be described. FIG. 5 shows the characteristics of modulation distortion due to the signal delay between the amplitude signal and the phase signal, and compensation amounts for the signal delay which are based on change in temperature (decrease in temperature). FIG. 5 shows the modulation distortion characteristics A (plotted by black circles) when the temperatures of both the power amplifier 107 and the LPF 105 are 20° C., and modulation distortion characteristics C (plotted by white circles) when the temperature of the power amplifier 107 is −10° C. and the temperature of the LPF 105 is −20° C.

If the temperature of the power amplifier 107 decreases from 20° C. to −10° C. and the temperature of the LPF 105 decreases from 20° C. to −20° C. the first temperature measurement unit 201 notifies, via the ADC 108, the calculation unit 109 of temperature information representing the measured temperature of the power amplifier 107. Similarly, the second temperature measurement unit 202 notifies, via the ADC 108, the calculation unit 109 of temperature information representing the measured temperature of the LPF 105.

The calculation unit 109 calculates a compensation amount $D_{PA}$ for the signal delay that is caused by the power amplifier 107, based on the temperature information about the power amplifier 107, and calculates a compensation amount $D_{LPF}$ for the signal delay that is caused by the LPF 105, based on the temperature information about the 105. Here, the temperature compensation coefficient $K_{PA}$ of the power amplifier 107 when the temperature decreases is −0.3 [ns/° C.], which is different from the value when the temperature increases. On the other hand, the temperature compensation coefficient $K_{LPF}$ of the LPF 105 is +0.3 [ns/° C.], which is the same as the value when the temperature increases.

According to (expression 1) described in the first embodiment of the present invention, the $D_{PA}$ for the signal delay that is caused by the power amplifier 107 is −9 [ns], and the compensation amount $D_{LPF}$ for the signal delay that is caused by the LPF 105 is +6 [ns]. Further, the compensation amount D for the signal delay in the whole of the polar modulator 200 is calculated as −3 [ns] in accordance with (expression 2) described above.

In the initial state where the temperatures of both the power amplifier 107 and the LPF 105 are 20° C., the delay adjustment unit 102 sets the signal delay at 0 ns. Next, the delay adjustment unit 102 adjusts the signal delay from 0 ns to −3 ns, based on the compensation amount D for the signal delay which has been calculated as −3 [ns] by the calculation unit 109.

If the temperature of the power amplifier 107 decreases from 20° C. to −10° C. and the temperature of the LPF 105 decreases from 20° C. to −20° C. the characteristics of modulation distortion greatly change from A to C. In this case, if the signal delay remained at 0 ns as set in the initial state, the modulation distortion would be −42 dBc. However, as described above, since the delay adjustment unit 102 adjusts the signal delay from 0 ns to −3 ns, the modulation distortion is −52 dBc.

As described above, according to the polar modulator 200 of the second embodiment of the present invention, also when the temperatures of the function blocks (electronic components) of the polar modulator 200 decrease, since the signal delay between the amplitude signal and the phase signal is adjusted, based on the temperature information about the power amplifier 107 and the temperature information about the LPF 105, in accordance with changes in the temperatures, the modulation distortion due to the signal delay can be approximated to the optimal state.

In the present embodiment, the value of the temperature compensation coefficient $K_{PA}$ of the power amplifier 107 is different depending on whether the temperature of the power amplifier 107 increases or decreases from the reference temperature. On the other hand, the value of the temperature compensation coefficient $K_{LPF}$ of the LPF 105 is the same regardless of whether the temperature of the power amplifier 105 increases or decreases from the reference temperature. Thus, the temperature compensation coefficients depend on the characteristics of the function blocks (electronic components), and in some cases, the value of the temperature compensation coefficient of a function block (electronic component) may vary depending on the way in which the temperature thereof changes. If the temperature compensation coefficients are minutely set based on the characteristics of the function blocks (electronic components), the signal delay can be adjusted with enhanced accuracy, and thus the modulation distortion due to the signal delay can be approximated to the optimal state.

Third Embodiment

Figure 6:
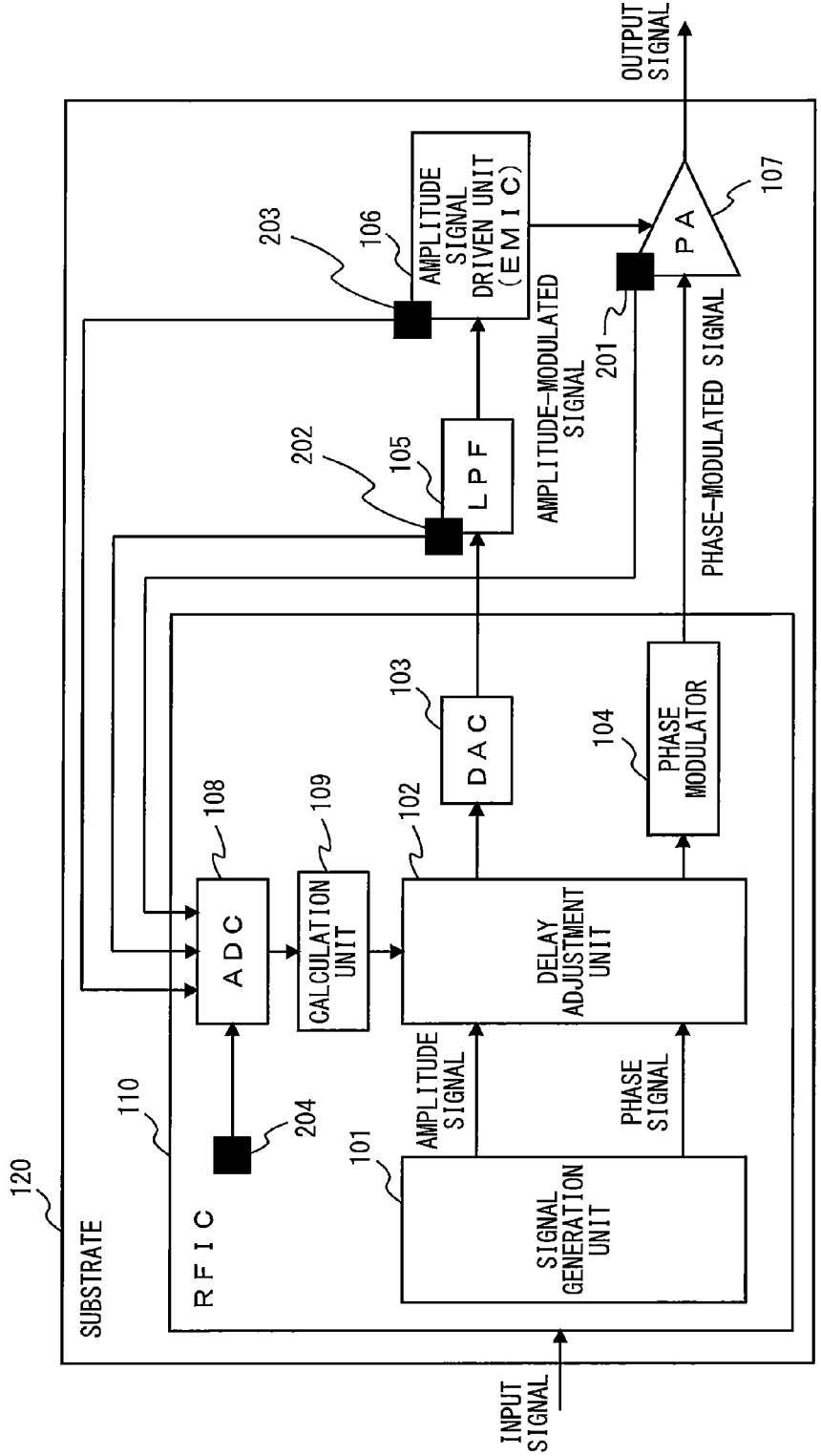
FIG. 6 shows a polar modulator 300 according to a third embodiment of the present invention.

FIG. 6 shows a polar modulator 300 according to the third embodiment of the present invention. In FIG. 6, the polar modulator 300 according to the present embodiment includes the components of the polar modulator 200 according to the second embodiment of the present invention, and further includes a third temperature measurement unit 203 for measuring the temperature of the amplitude signal driven unit 106 and a fourth temperature measurement unit 204 for measuring the temperature of the RFIC 110. In FIG. 6, the components of the polar modulator 300 according to the present embodiment that are the same as those of the polar modulator 200 according to the second embodiment of the present invention are denoted by the same reference characters, and the description thereof is omitted.

The calculation unit 109 calculates a compensation amount $D_{PA}$ for the signal delay that is caused by the power amplifier 107, based on temperature information representing the temperature of the power amplifier 107 measured by the first temperature measurement unit 201. Similarly, the calculation unit 109 calculates a compensation amount $D_{LPF}$ for the signal delay that is caused by the LPF 105, based on temperature information representing the temperature of the LPF 105 measured by the second temperature measurement unit 202. Further, the calculation unit 109 calculates a compensation amount $D_{EMIC}$ for the signal delay that is caused by the amplitude signal driven unit 106, based on temperature information representing the temperature of the amplitude signal driven unit 106 measured by the third temperature measurement unit 203. The calculation unit 109 calculates a compensation amount $D_{RFIC}$ for the signal delay that is caused by the RFIC 110, based on temperature information representing the temperature of the RFIC 110 measured by the fourth temperature measurement unit 204. Each of the $D_{PA}$, $D_{LPF}$, $D_{EMIC}$, and $D_{RFIC}$ is calculated in accordance with (expression 1) described in the first embodiment of the present invention. Further, a compensation amount D for the signal delay in the whole of the polar modulator 300 is calculated by using the $D_{PA}$, $D_{LPF}$, $D_{EMIC}$, and $D_{RFIC}$, in accordance with (expression 3) shown below.

$$D=D_{PA}+D_{LPF}+D_{EMIC}+D_{RFIC} \quad \text{(expression 3)}$$

As described above, the calculation unit 109 calculates the compensation amount D for the signal delay in the whole of the polar modulator 300, based on the temperature information about the power amplifier 107, the LPF 105, the amplitude signal driven unit 106, and the RFIC 110. Then, the delay adjustment unit 102 adjusts the signal delay between the amplitude signal and the phase signal, based on the compensation amount D for the signal delay in the whole of the polar modulator 300 which has been calculated by the calculation unit 109. Therefore, the modulation distortion due to the signal delay in the whole of the polar modulator 300 becomes more approximate to the optimal state than that in the polar modulator 200 according to the second embodiment of the present invention.

When the signal delay between the amplitude signal and the phase signal is adjusted based on temperature information about function blocks (electronic components) of the polar modulator in accordance with changes in the temperatures, the larger the number of function blocks about which the temperature information is obtained, the more the modulation distortion due to the signal delay is approximate to the optimal state. In particular, it is remarkably effective to adjust the signal delay between the amplitude signal and the phase signal based on temperature information about analog components of the polar modulator, such as the power amplifier and the LPF, because the signal delay changes significantly with changes in the temperatures of the analog components.

The compensation amount D for the signal delay in the whole of the polar modulator 300 can be represented by the following (expression 4), by using coefficients k1 to k4 which depend on the characteristics of the function blocks (electronic components) of the polar modulator, and temperature information T1 to T4 about the function blocks (electronic components).

$$D=k1 \times T1+k2 \times T2+k3 \times T3+k4 \times T4 \quad \text{(expression 4)}$$

The polar modulator 300 according to the present embodiment may previously store, in a memory or the like, the above-described (expression 4) and coefficients k1 to k4 which depend on the characteristics of the function blocks (electronic components). The calculation unit 109 can calculate the compensation amount D for the signal delay in the whole of the polar modulator 300, based on (expression 4) and the coefficients k1 to k4 which are previously stored in a memory or the like and based on the temperature information from the first to fourth temperature measurement units 201 to 204.

In addition, the polar modulator 300 according to the present embodiment may store, in a look-up table, compensation amounts for the signal delay which correspond to values of the temperatures of the function blocks (electronic components). FIG. 7 shows compensation amounts for the signal delay which correspond to values of the temperatures of the function blocks (electronic components). Calculated results of k1×T1, k2×T2, k3×T3, and k4×T4 in (expression 4) described above are previously stored in the look-up table. In this case, the calculation unit 109 refers to the look-up table shown in FIG. 7, based on the temperature information from the first to fourth temperature measurement units 201 to 204, thereby acquiring compensation amounts for the signal delay which correspond to the measured temperatures of the function blocks (electronic components). If the obtained temperatures of the function blocks are not represented in the look-up table, the calculation unit 109 can calculate the compensation amount D for the signal delay in the whole of the polar modulator 300 by just calculating compensation amounts by linear interpolation and summing the compensation amounts.

The compensation amount D for the signal delay in the whole of the polar modulator 300 is calculated by using the coefficients k1 to k4 which depend on the characteristics of the function blocks (electronic components) of the polar modulator. However, the present invention is not limited thereto. For example, functions f1 to f4 which depend on the characteristics of the function blocks (electronic components) may be used. In this case, (expression 4) described above can be represented as the following (expression 4)'.

$$D=f1(T1)+f2(T2)+f3(T3)+f4(T4) \quad \text{(expression 4)'}$$

Fourth Embodiment

Figure 8:
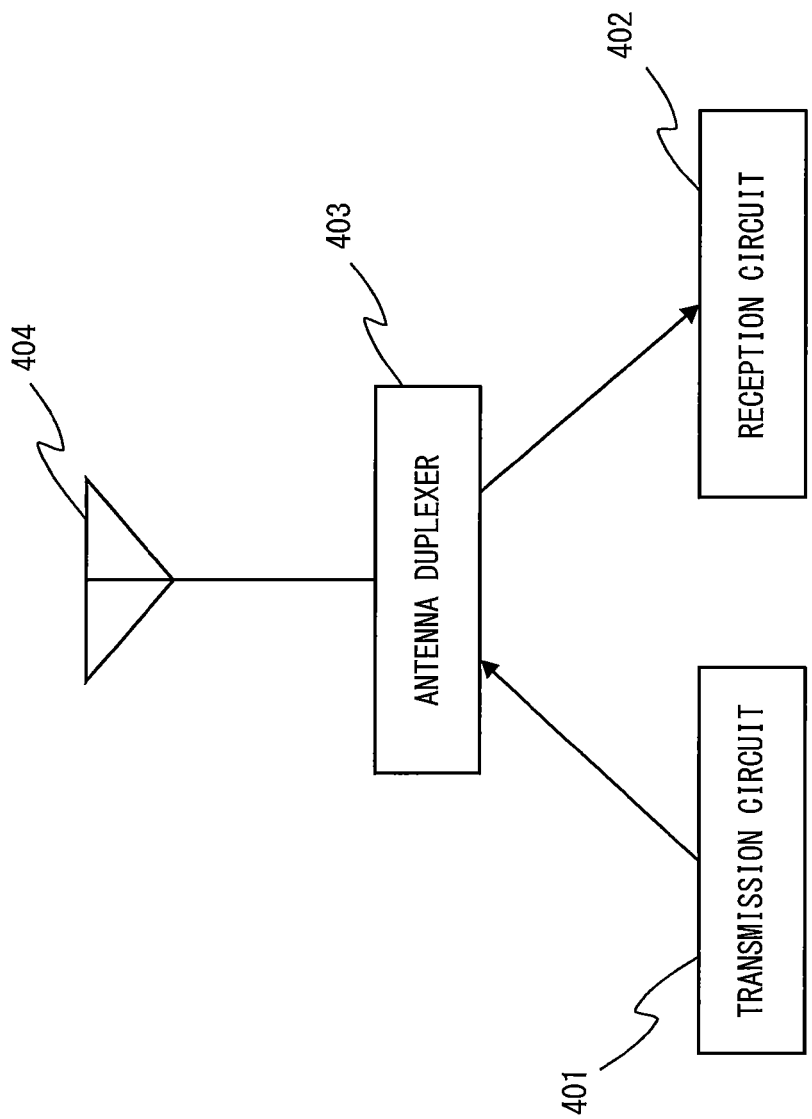
FIG. 8 shows a communication device 400 according to a fourth embodiment of the present invention.
Figure 9:
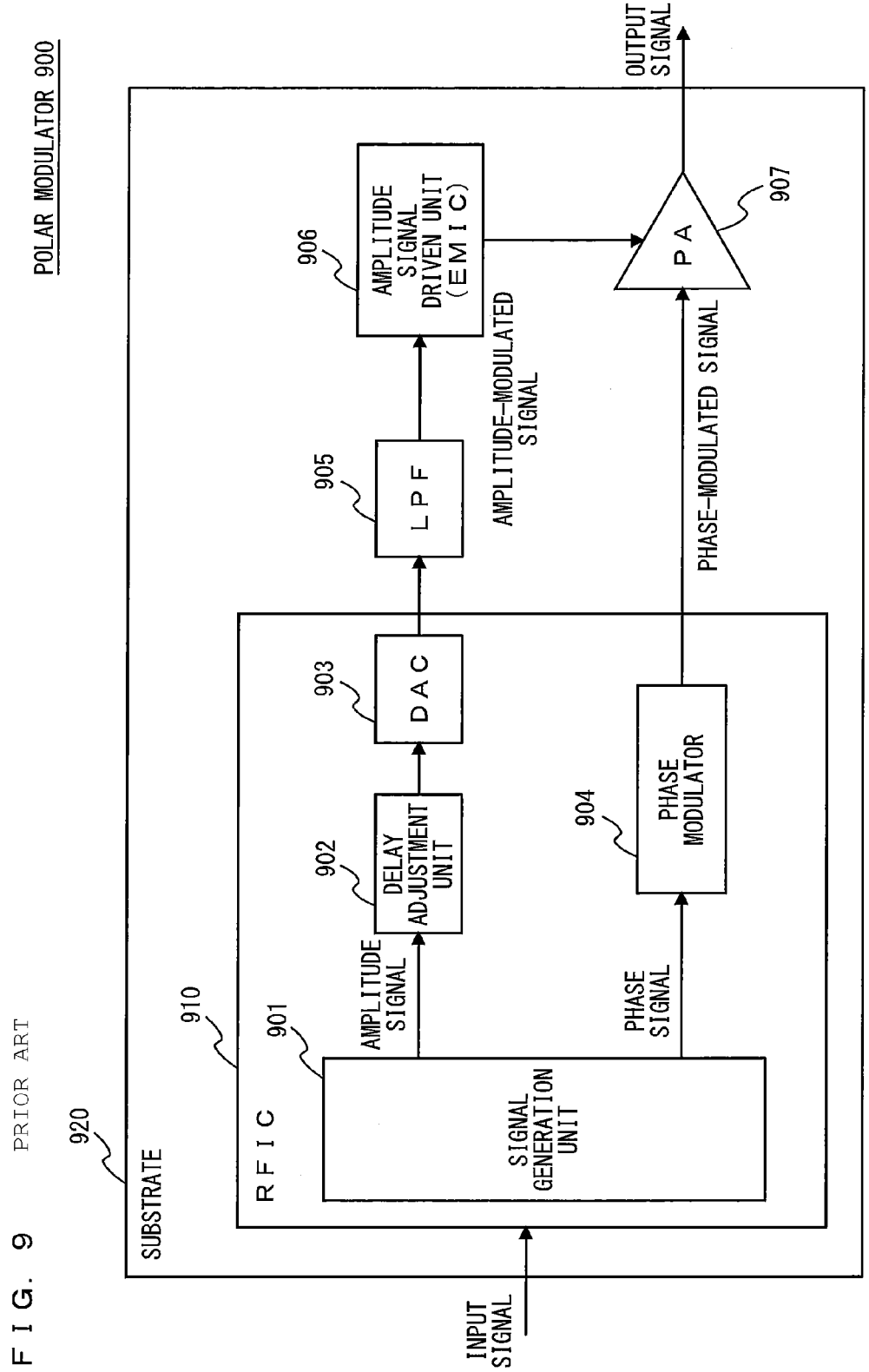
FIG. 9 shows a conventional polar modulator 900.
Figure 10:
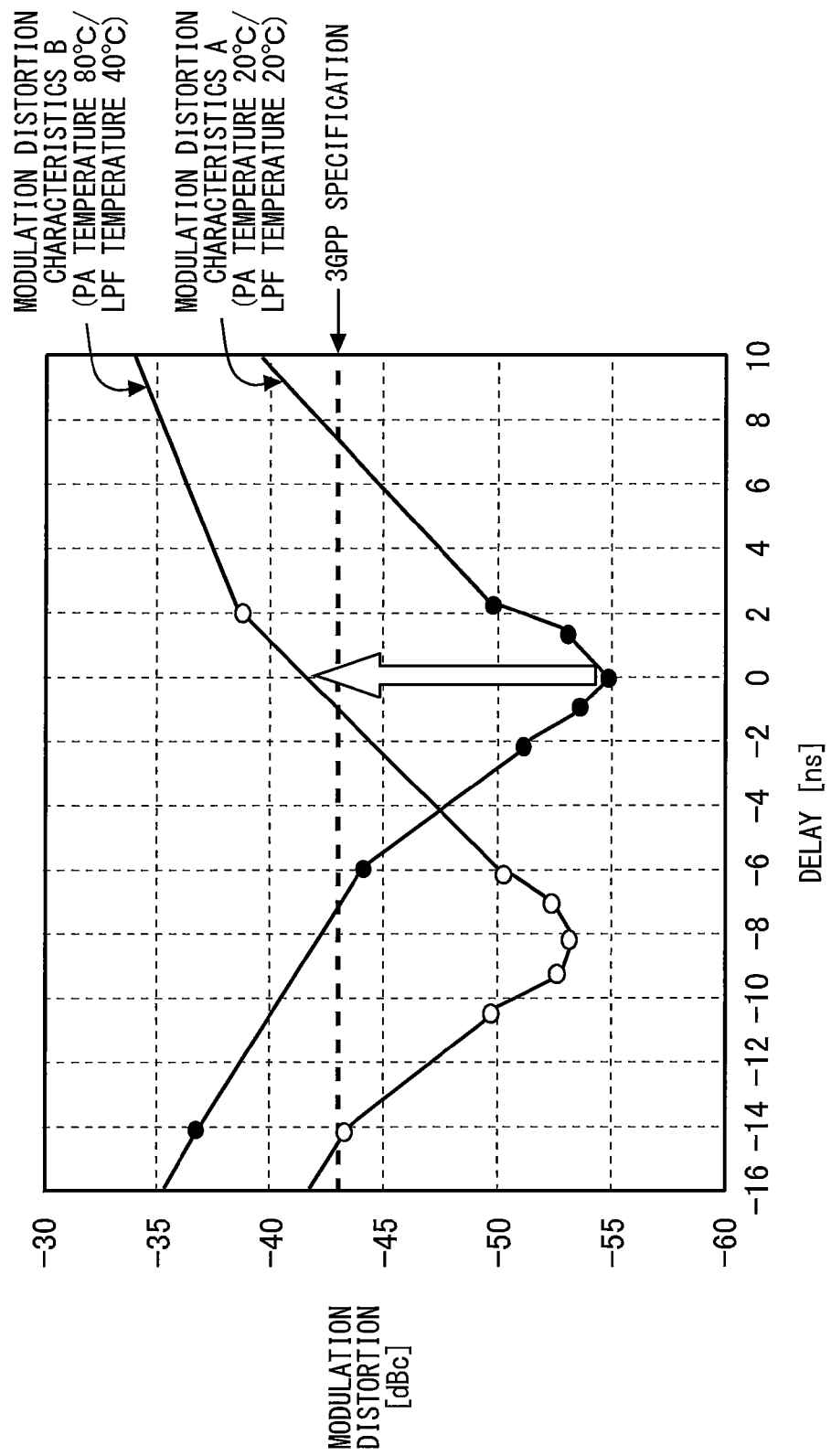
FIG. 10 shows the characteristics of modulation distortion due to the signal delay between an amplitude signal and a phase signal.

FIG. 8 shows a communication device according to the fourth embodiment of the present invention. In FIG. 8, the communication device 400 includes a transmission circuit 401, a reception circuit 402, an antenna duplexer 403, and an antenna 404. One of the above-described polar modulators 100 to 300 according to the first to third embodiments of the present invention is used as the transmission circuit 401.

The antenna duplexer 403 transmits, to the antenna 404, a transmission signal outputted from the transmission circuit 401, and prevents the transmission signal from leaking into the reception circuit 402. Further, the antenna duplexer 403 transmits, to the reception circuit 402, a reception signal inputted from the antenna 404, and prevents the reception signal from leaking into the transmission circuit 401. The transmission signal is outputted from the transmission circuit 401, and released out into space from the antenna 404 via the antenna duplexer 403. The reception signal is received by the antenna 404, and then received by the reception circuit 402 via the antenna duplexer 403.

Since one of the polar modulators 100 to 300 according to the first to third embodiments is used as the transmission circuit 401, it is understood that the same effect as described in the first to third embodiments can be obtained in the transmission circuit 401.

As described above, according to the communication device 400 of the fourth embodiment, even when the temperatures of the function blocks (electronic components) of the transmission circuit 401 change, since the signal delay between an amplitude signal and a phase signal is adjusted based on temperature information about the function blocks (electronic components) in accordance with changes in the temperatures, modulation distortion due to the signal delay can be adjusted to an optimal state.

In addition, since the output of the transmission circuit 401 is not branched out to a directional coupler or the like, it is possible to reduce loss on the path from the transmission circuit 401 to the antenna 404, and thus possible to reduce power consumption at the time of transmission. This enables the communication device 400 to be used as a wireless communication device for a long time period. The communication device 400 may include only the transmission circuit 401 and the antenna 404.

INDUSTRIAL APPLICABILITY

The present invention is applicable to, for example, communication devices such as mobile phones and wireless LAN devices, and is particularly useful in the case where, for example, the temperatures of function blocks (electronic components) change.

DESCRIPTION OF THE REFERENCE CHARACTERS 100, 200, 300, 900 polar modulator
101, 901 signal generation unit
102, 902 delay adjustment unit
103, 903 DAC
104, 904 phase modulator
105, 905 low-pass filter (LPF)
106, 906 amplitude signal driven unit
107, 907 power amplifier (PA)
108 ADC
109 calculation unit
110, 910 RFIC
120, 920 substrate
201, 202, 203, 204 temperature measurement unit
400 communication device
401 transmission circuit
402 reception circuit
403 antenna duplexer
404 antenna
A, B, C modulation distortion characteristics

The invention claimed is:

1. A polar modulator comprising:
a signal generation unit configured to generate an amplitude signal and a phase signal from an input signal;
an amplitude signal driven unit configured to output a modulation voltage based on the amplitude signal;
a phase modulator configured to output a phase-modulated signal based on the phase signal;
a power amplifier configured to modulate an amplitude of the phase-modulated signal, based on the modulation voltage;
a temperature measurement unit configured to measure a temperature of the power amplifier; and
a delay adjustment unit configured to adjust a signal delay between the amplitude signal and the phase signal, based on the temperature of the power amplifier.

2. The polar modulator according to claim 1, further comprising a low-pass filter configured to output, to the amplitude signal driven unit, a low frequency component of the amplitude signal generated by the signal generation unit, wherein
the temperature measurement unit measures temperatures of the power amplifier and the low-pass filter.

3. The polar modulator according to claim 1, wherein the temperature measurement unit measures temperatures of the power amplifier and the amplitude signal driven unit.

4. The polar modulator according to claim 1, further comprising a compensation amount calculation unit configured to calculate a compensation amount for the signal delay, based on the temperature measured by the temperature measurement unit.

5. The polar modulator according to claim 4, wherein
the signal generation unit, the delay adjustment unit, the phase modulator, and the compensation amount calculation unit form a radio frequency integrated circuit, and
the temperature measurement unit measures temperatures of the power amplifier and the radio frequency integrated circuit.

6. The polar modulator according to claim 4, further comprising a temperature compensation amount storage unit configured to previously store compensation amounts for the signal delay which correspond to values of the temperatures of the power amplifier, wherein
the compensation amount calculation unit obtains a compensation amount for the signal delay stored in the temperature compensation amount storage unit, based on the temperature measured by the temperature measurement unit.

7. The polar modulator according to claim 4, further comprising a temperature compensation coefficient storage unit configured to previously store temperature compensation coefficients equivalent to compensation amounts for the signal delay for an amount of change in the temperature of the power amplifier, wherein
the compensation amount calculation unit obtains a temperature compensation coefficient stored in the temperature compensation coefficient storage unit, based on the temperatures measured by the temperature measurement unit, and calculates a compensation amount for the signal delay.

8. A communication device comprising:
a transmission circuit configured to generate a transmission signal; and
an antenna configured to output the transmission signal generated by the transmission circuit, wherein
the polar modulator according to claim 1 is used for the transmission circuit.

9. The communication device according to claim 8, further comprising:
- a reception circuit configured to process a reception signal received from the antenna; and
- an antenna duplexer configured to output, to the antenna, the transmission signal generated by the transmission circuit, and output, to the reception circuit, the reception signal received from the antenna.

* * * * *